United States Patent
Wright et al.

(10) Patent No.: US 6,880,145 B1
(45) Date of Patent: Apr. 12, 2005

(54) METHOD FOR DETERMINING DIE PLACEMENT BASED ON GLOBAL ROUTING ARCHITECTURE

(75) Inventors: Andrew J. Wright, Mountain View, CA (US); James H. Lie, Santa Clara, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 104 days.

(21) Appl. No.: 10/029,089

(22) Filed: Dec. 21, 2001

(51) Int. Cl.[7] .............................................. G06F 17/50
(52) U.S. Cl. .............................. 716/12; 703/1; 257/202
(58) Field of Search ............................. 716/12; 703/1; 257/202, 786

(56) References Cited

U.S. PATENT DOCUMENTS

| | | | | |
|---|---|---|---|---|
| 5,543,640 A | * | 8/1996 | Sutherland et al. | 257/202 |
| 5,608,638 A | * | 3/1997 | Tain et al. | 700/121 |
| 5,634,267 A | * | 6/1997 | Farnworth et al. | 29/840 |
| 5,818,114 A | * | 10/1998 | Pendse et al. | 257/786 |
| 6,057,169 A | * | 5/2000 | Singh et al. | 438/14 |
| 6,064,194 A | * | 5/2000 | Farnworth et al. | 324/158.1 |
| 6,225,143 B1 | * | 5/2001 | Rao et al. | 438/106 |
| 6,319,752 B1 | * | 11/2001 | Tain et al. | 438/10 |
| 6,323,559 B1 | * | 11/2001 | Chan et al. | 257/778 |
| 6,376,914 B1 | * | 4/2002 | Kovats et al. | 257/777 |
| 6,515,509 B1 | * | 2/2003 | Baxter | 326/39 |
| 2001/0003375 A1 | * | 6/2001 | Kovats et al. | 257/685 |
| 2002/0152055 A1 | * | 10/2002 | Ito et al. | 703/1 |

* cited by examiner

*Primary Examiner*—A. M. Thompson
(74) *Attorney, Agent, or Firm*—Christopher P. Maiorana, PC

(57) ABSTRACT

A method for interconnecting a plurality of dies. The method generally includes receiving a plurality of interconnect requirements for the dies. The interconnect requirements may include a priority for each of a plurality of nets. A position and an angle for one of the dies relative to a substrate may be calculated in response to the interconnect requirements. A plurality of nets may then be routed among the dies and a plurality of substrate pads defining external connections for the substrate. The dies may be mounted to the substrate after routing has been finalized.

18 Claims, 7 Drawing Sheets

112

114
DIE INFORMATION IS DEFINED. E.G., DIE SIZE, PAD LOCATIONS. INFORMATION IS STORED

116
NETLIST IS CREATED, DEFINING SUBSTRATE CONNECTIONS

118
ROUTING PARAMETERS ARE CREATED AND STORED. E.G., PRIORITY OF SIGNALS

120
THE ABOVE INFORMATION COLLECTED IS STORED AND THEN PROCESSED BY A MACHINERY (OR SOFTWARE) THAT WILL PERFORM THE NEXT PLACEMENT STEPS

METHOD FOR DETERMINING DIE PLACEMENT BASED ON GLOBAL ROUTING ARCHITECTURE

FIELD OF THE INVENTION

The present invention relates to a method and/or architecture for automatic trace routing and, more particularly, to a method and/or architecture for determining die placement and die orientation with respect to a substrate to achieve interconnection requirements.

BACKGROUND OF THE INVENTION

Conventional multi-die semiconductor packages are organized internally about Cartesian coordinates. One consequence of the Cartesian organization is that some traces on the substrate follow long and complex routes. With the Cartesian approach, the routing becomes unnecessarily long due to large distances between pads on different dies that are not on edges facing each other. The non-facing pad situation complicates and lengthens routes and causes increased signal propagation delays.

A large number of long traces on the substrate commonly reduces available space for routing. The reduced available space potentially causes difficulty in substrate designs where a number of traces are required, such as feature-rich devices. In some cases, a larger package size is required to accommodate the inefficient routing, thus increasing signal delays. As more and more multi-chip products are being made and the dies involved become more complicated and require large amounts of inter-connections, a reliable, automated, efficient way of determining optimal die orientation is important to ensure that the package substrate design is optimal and without unnecessary iterations.

SUMMARY OF THE INVENTION

The present invention concerns a method for interconnecting a plurality of dies. The method generally comprises the steps of (A) receiving a plurality of interconnect requirements for the dies; (B) calculating a position and an angle for one of the dies relative to a substrate in response to the interconnect requirements; and (C) routing a plurality of nets among the dies and a plurality of substrate pads.

The objects, features and advantages of the present invention include providing a method and/or architecture for determining die placement and orientation with respect to a substrate that may (i) decrease signal propagation delays, (ii) decrease propagation delay variations within a trace group, (iii) decrease signal routing complexity, (iv) decrease space consumed by traces, (v) decrease trace lengths, and/or (vi) position dies closer to each other.

BRIEF DESCRIPTION OF THE DRAWINGS

These and other objects, features and advantages of the present invention will be apparent from the following detailed description and the appended claims and drawings in which:

FIG. 2 is a flow diagram of a pre-layout stage of a die placement process;

DETAILED DESCRIPTION OF THE PREFERRED EMBODIMENTS

The invention generally defines a die placement process for determining optimal die placement and die angles in a multi-chip package where the dies may be relatively rotated from the perspective of traditional Cartesian approach in which the dies are placed in a rigid imaginary x-y coordinate system. The process may orient some or all of the dies non-parallel and non-perpendicular to the x-y axes. The process may also result in die angles of 0, 90, 180, 270, and 360 degrees relative to the x-y coordinate system.

The process for determining relative die placement and die angles on the substrate may minimize routing complexity, increase routing space, and reduce trace lengths. The process may achieve the above by taking into account various routing requirements, rules and parameters for substrate connections and then finding the appropriate placement and angles. The dies in the package are generally existing dies with information at least sufficient for the die placement process defined herein (e.g., the die size and die pad locations).

The die placement process generally comprises three major stages. First, the pre-layout stage may involve defining Connections to be made in the substrate and what requirements exist for the connections. Second, die placement positions and angles may be defined. Third, (i) an actual layout of traces and (ii) adjustments to the die placement and angles where needed may be performed. The process may produce a completed substrate layout if the substrate is routable.

Figure 1:
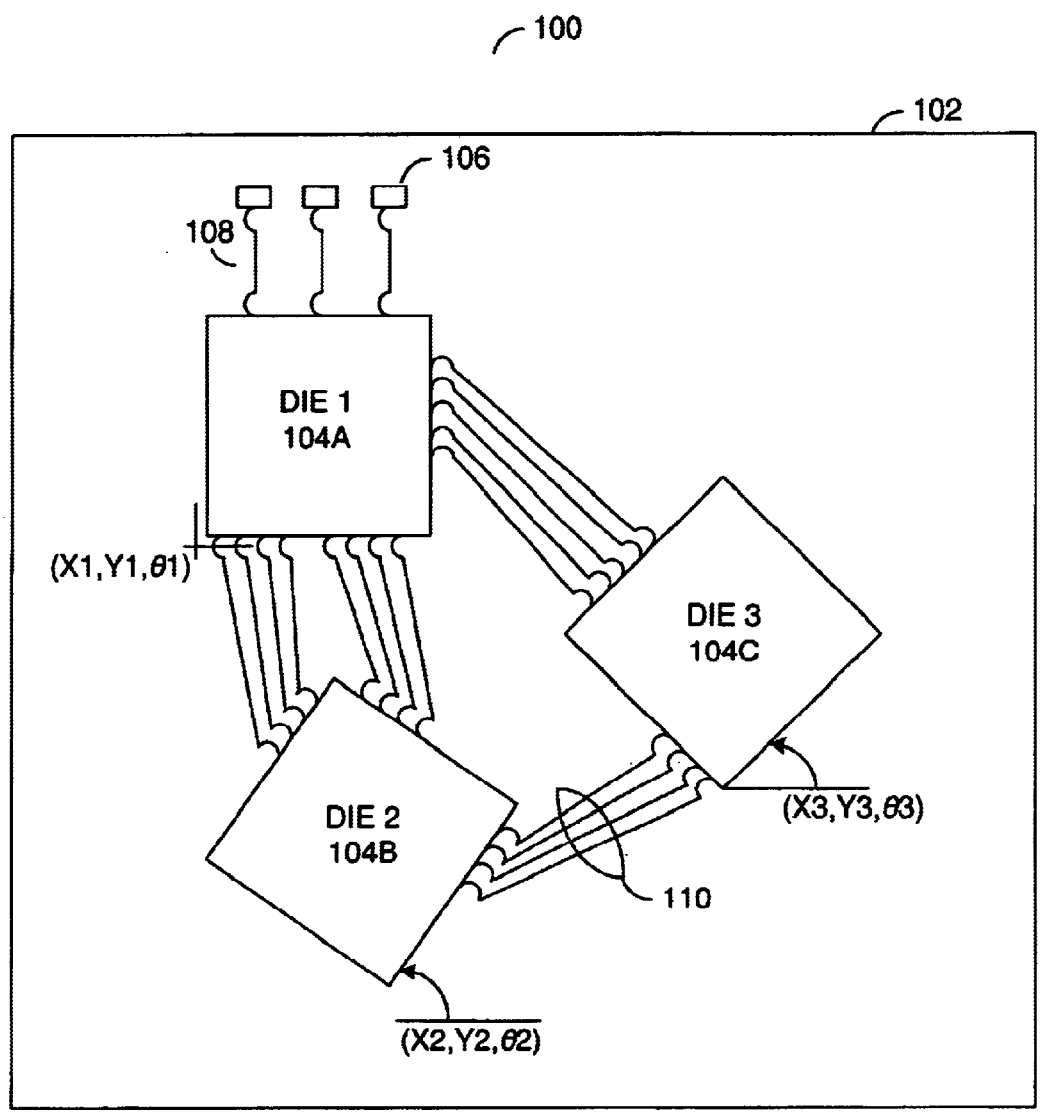
FIG. 1 is a drawing of a multi-chip package arranged according to a preferred embodiment of the present invention.

Referring to FIG. 1, a drawing of a multi-chip package 100 is shown in accordance with a preferred embodiment of the present invention. The package 100 generally comprises a substrate 102 and two or more dies 104A–C. The substrate 102 generally comprises multiple substrate pads 106 and multiple substrate traces 108. The substrate pads 106 may be connected to pins and/or balls (not shown) that define connections for the dies 104A–C external to the package 100. The substrate pads 106 may also be connected to the traces 108 interconnecting two or more of the dies 104A–C.

Each die 104A–C may be positioned on the substrate 102 in terms of Cartesian coordinates (e.g., (Xn,Yn) where $1 \leq n \leq C$ identifies a unique die 104A–C). The position of each die 104 may be measured from a corner of the die 104, a center of the die 104, or some other suitable reference point on the die 104. Each die 104A–C may also be oriented at an angle (e.g., $\theta n$ where $1 \leq n \leq C$) as measured from an axis (e.g., counterclockwise from the x-axis) of the Cartesian coordinates. The angle $\theta n$ may range from 0 degrees to 360 degrees. Other position schemes and orientation schemes may be implemented to meet the design criteria of a particular application.

Each trace 108 may be a single layer or a multi-layer conductor path across/through the substrate 102. Each trace 108 may be routed individually or as part of a trace group 110 comprising several traces 108. An example of a trace group 110 is generally shown as four traces 108 connecting the die 104B and the die 104C. The traces 108 and the trace groups 110 are generally routed as inter-die connections and as die-to-pin/ball connections. The traces 108 and trace groups 110 may be used for, but are not limited to, digital signals, analog signals, power signals, ground signals, ground planes and shielding.

Referring to FIG. 2, a flow diagram of a method for a pre-layout stage 112 of the die placement process is shown. The pre-layout stage 112 generally starts by defining and storing interconnect requirements for each of the dies 104A–C (e.g., block 114).: The interconnect requirements generally comprise die size, positions of pads on the die, signals assigned to each pad, power requirements, grounding requirements, and the like. The interconnect requirements may include an initial placement position and/or initial orientation. Additional die information may be defined and stored as necessary to meet the design criteria of a particular application.

The pre-layout stage 112 may create a netlist (e.g., block 116). The netlist may be defined as a description in some fashion of the connections in the substrate 102. Such connections include die pad-to-die pad connections among the dies 104A–C and die pad-to-substrate pad connections for accessing the pins/balls. The netlist may be in the form of (i) a table showing what each pad is connected to or (ii) a graphical representation of the connections, as in traditional schematic drawings or a ratsnest drawing. A ratsnest generally shows each connection as a straight line that cross each other and pass through the dies 104A–C and any other components that may be mounted on the substrate 102.

Routing parameters may be defined and stored for each net of the netlist (e.g., block 118). The routing parameters generally comprise priorities of each net to be routed in the substrate 102, maximum net lengths and/or delays, a minimum (e.g., smallest) net length and/or delay possible, ratsnest lengths and/or delays, ranges of net lengths and/or delays, trace groups 110 with specific routing relationships among the traces 108 within the group 110, shielding requirements, and so on. Requirements within a trace group 110 may include, but are not limited to, a maximum length and/or delay variation among the individual nets within the trace group 110. For example, the length of each trace 108 in a particular trace group 110 may be required to fall within 1 millimeter of each other. In general, each trace 108 within a trace group 110 may have the same priority level.

The die interconnect requirements, routing parameters and any other information necessary for automatic routing collected and stored may be processed in preparation for the placement step. (e.g., block 120). The processing is generally accomplished by a machine such as a computer (FIG. 7) executing a software program. The processed information may be stored as an electronic file that is readable by the computer.

Figure 3:
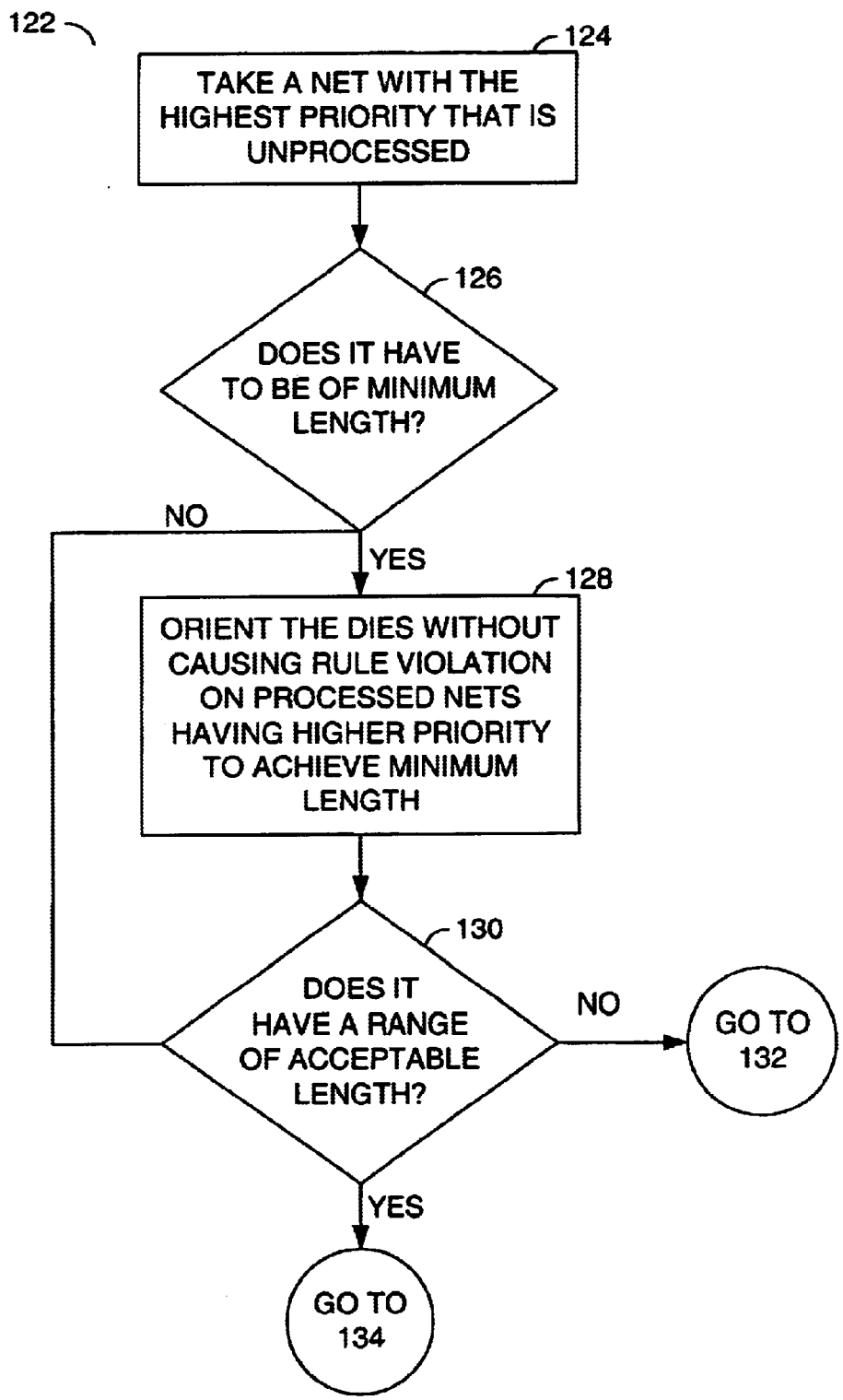
FIG. 3 is a flow diagram for a first portion for a placement stage of the die placement process.

Referring to FIG. 3, a flow diagram for a first portion for a placement stage 122 of the die placement process is shown. The placement stage 122 generally iterates through each net of the netlist. Placement may begin with a highest priority net and continue to lower priority nets until all of the nets have been considered. The net currently being process may be referred to as a target net. During each pass through the placement stage 122, the position and orientation of each die 104A–C may be modified from the initial position and/or the initial orientation.

The placement stage 122 may begin with the target net having the highest priority (e.g., block 124). As stated above, the highest priority net may be an individual trace 108 or a trace group 110. A check may be made (e.g., decision block 126) to determine if the target net should have a minimum length and/or delay.

If the target net should have a minimum length and/or delay (e.g., the YES branch of decision block 126), then the position and orientation of each die 104A–C associated with the target net may be changed (e.g., block 128). Changing the position and orientation of the dies 104A–C generally means (i) moving the dies 104A–C with respect to each other relative to the substrate 102 and (ii) rotating one or more dies 104A–C by a number of degrees either clockwise or counter-clockwise. The position and orientation changes are generally made to minimize the length and/or delay of the target net.

If the target net does not have a minimum length and/or delay requirement (e.g., the NO branch of decision block 126), then a second check may be made for the target net against another requirement (e.g., decision block 130). The second check may also be performed after changing the position and orientation of the dies 104A–C where the target net requires the minimum length (e.g., block 128). The second check may determine if the target net currently has a length and/or delay within an acceptable range of lengths and/or delays.

Figure 4:
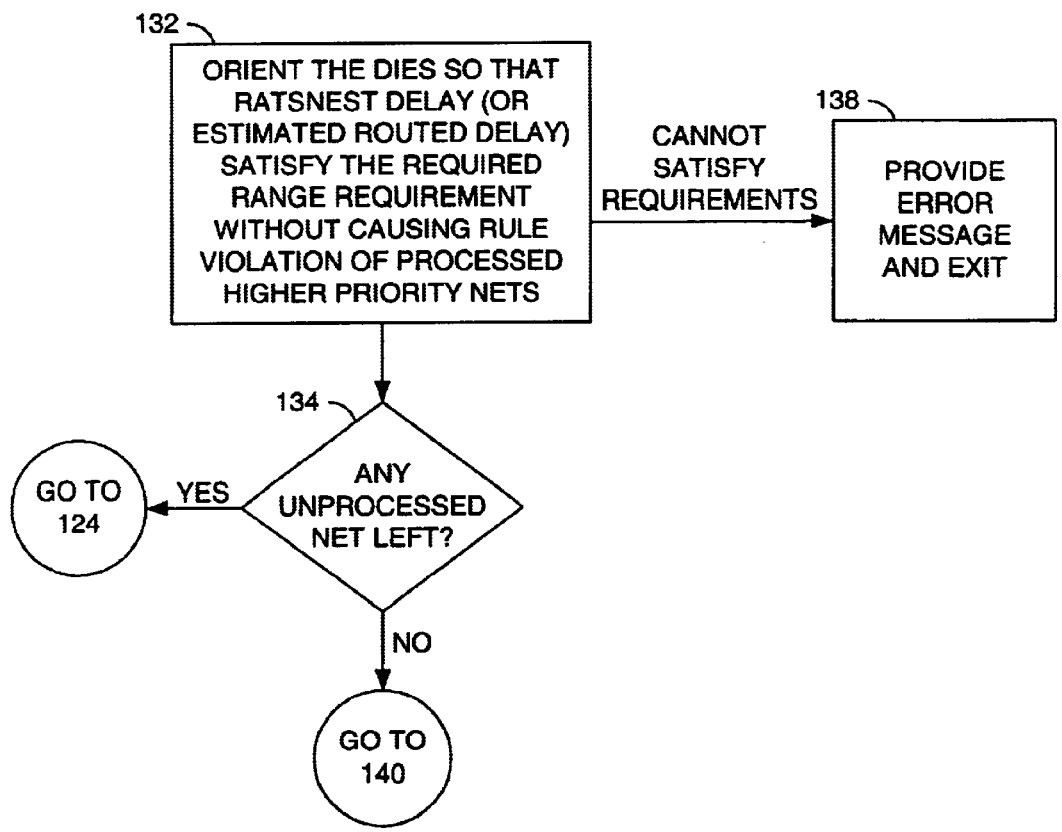
FIG. 4 is a flow diagram for a second portion for the placement stage of the die placement process.

Referring to FIG. 4, a flow diagram for a second portion for the placement stage 122 is shown If the target net is not within the acceptable range (e.g., the NO branch of decision block 130, FIG. 3), then the position and orientation of the associated dies 104A–C may be changed again (e.g., block 132). The change may place the dies 104A–C such that a ratsnest length and/or delay satisfies a range requirement for the target net without causing a rule violation for each previously processed net having a higher priority. If the target net is within the acceptable range (e.g., the YES branch of decision block 130, FIG. 3), then a check may be made for any additional unprocessed nets (e.g., decision block 134).

If the placement for the ratsnest requirement is successful, then a check is made to see if the target net is the last unprocessed net (e.g., decision block 134). If more unprocessed nets exist (e.g., the YES branch of decision block 134), then the process returns to block 124 in FIG. 3 and iterates with the next highest priority net. If there are no more unprocessed nets (e.g., the NO branch of decision block 134), then the process may continue with the routing step 136 (FIG. 5).

If the placement change for the ratsnest requirement is unsuccessful, then an error message may be provided and the process exited (e.g., block 138). The error message may indicate the nature of a problem for the target net. The error message may identify the particular trace 108, and trace group 110 if appropriate, as well as the requirements and/or routing rules that could not be satisfied.

Figure 5:
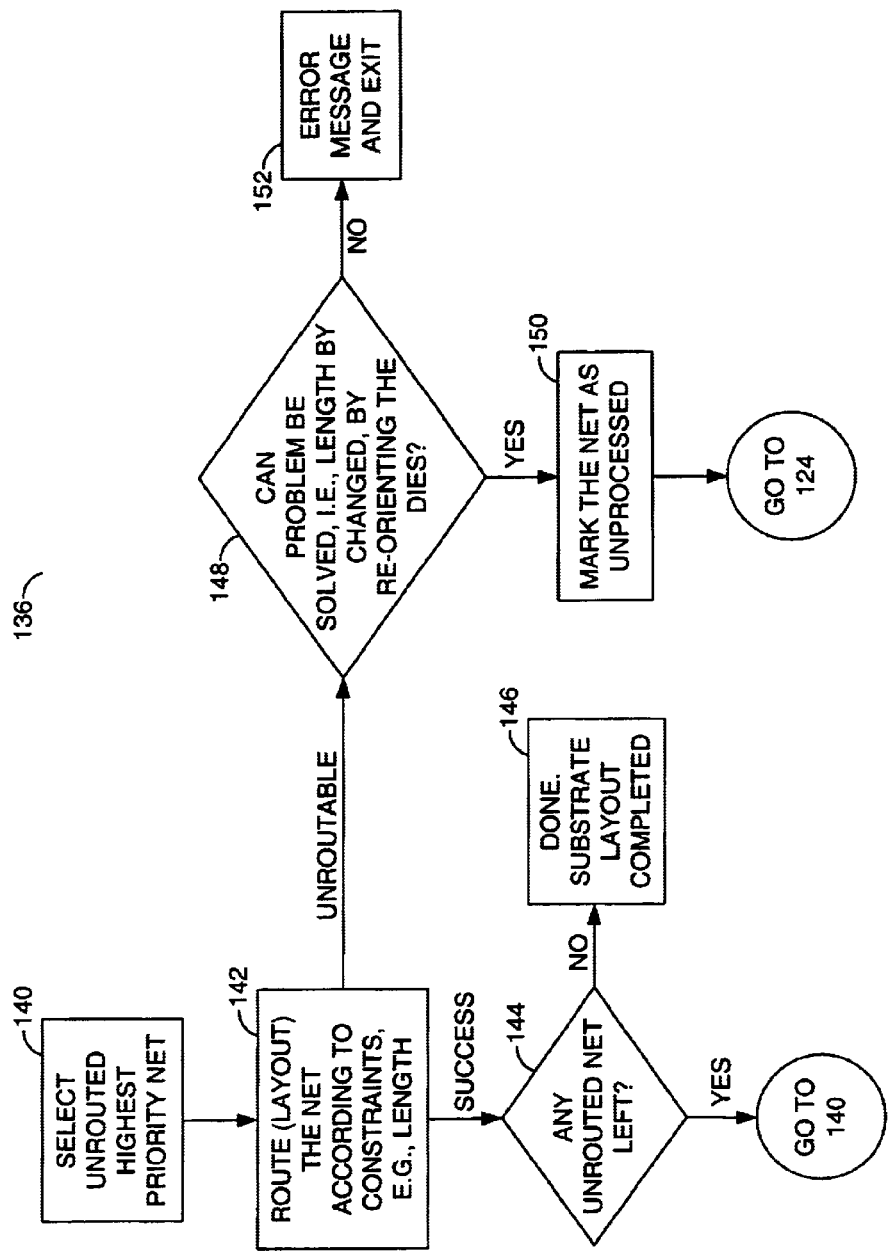
FIG. 5 is a flow diagram of a method for a routing stage of the die placement process.

Referring to FIG. 5, a flow diagram of a method for a routing stage 136 of the die placement process is shown. The routing stage 136 may begin with selecting a highest priority unrouted net (e.g., block 140) as the target net. A layout for the target net may be routed within the constraints for the target net (e.g., block 142). The constraints for the target net generally comprise the requirements for the target net, the routing rules, and a layout of any higher priority nets already defined in the substrate 102.

If the routing of the target net is successful, then a check is made to determine if any unrouted nets remain (e.g., decision block 144). If all of the nets have been successfully routed (e.g., the NO branch of decision block 144), then the process may end with a presentation of a successful completion message (e.g., block 146). If there are additional unrouted nets remaining (e.g., the YES branch of decision block 144), then processing may continue with the selection of the next highest priority unrouted net (e.g., block 140).

If the target net cannot be successfully routed, then the routing stage 136 may perform a test in an attempt to correct the routing problem (e.g., decision block 148). The routing stage 136 may attempt to successfully route the target net by changing the position and/or orientation of one or more of the dies 104A–C. If the change is successful (e.g., the YES branch of decision block 148), then the target net may be marked as unprocessed (e.g., block 150). The process may then return to the placement stage 122, block 124 for another iteration. If the change to the position and orientation of the dies 104A–C is unsuccessful (e.g., the No branch of decision block 148), then the routing stage 136 may present and error message and exit (e.g., block 152). The error message may identify the target net unsuccessfully routed, any failed constraints and the current positions and angles of the dies 104A–C.

Changing the position and/or orientation of the dies 104A–C without causing a rule violation for processed higher order nets generally means that the higher priority nets may be modified to a point that does not cause a violation of interconnect requirements or rules. Given a routed net A of a high priority and an unrouted net B of a lower priority, then the route for the net A may or may not be changed to satisfy a requirement and/or rule for the net B depending upon the requirements and rules for the net A. For example, routing of the net B may be successful if a maximum length requirement for the net A is not violated by changing the route of the net A. However, if the net A has a shortest possible length requirement, then any increases in the route length of the net A generally results in a failure while routing the net B.

Figure 6:
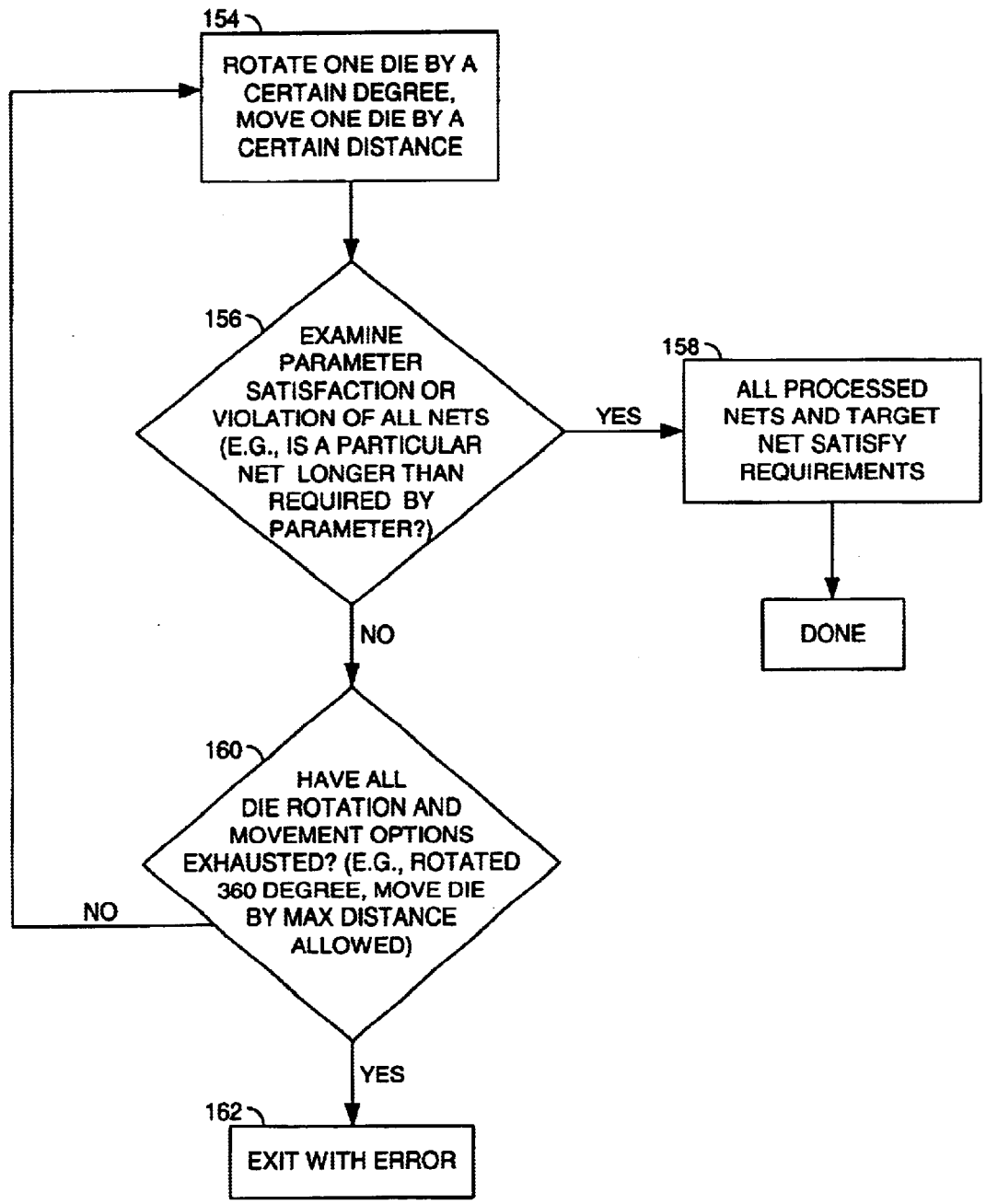
FIG. 6 is a flow diagram of a method for changing die position and orientation.

Referring to FIG. 6, a flow diagram of a method for changing die position and orientation within the die placement process is shown. The method may (i) rotate a die 104 by a predetermined angle in a calculated direction and/or (ii) move the die 104 by a predetermined distance in a calculated direction or directions (e.g., block 154). The calculated directions may be determined by the failed requirements and/or rules that the process is trying to correct. For example, if the failed requirement is for a shortest possible route length, then the calculated directions may rotate and move the dies in directions that minimize the route length. In another example, if the failed requirement is a maximum length, then the calculated directions may be multiple directions over predetermined ranges. The process may change a first die 104A such that (i) both the position direction and the orientation direction point toward a second die 104B, (ii) the position direction points toward and the orientation direction points away from the second die 104B, and (iii) the position direction points away from and the orientation direction points toward the second die 104B in attempts to shorten the route length.

Changes to the position of the first die 104A relative to the second die 104B along an x-axis and a y-axis relative to the substrate 102 may be limited to a finite range. The finite range may limit a number of possibilities examined by the die placement process. In one embodiment, the process may examine all possible positions and orientation. Situations where a die 104 interferes with another die 104 or other component mounted on the substrate 102 may be eliminated from consideration.

The steps sizes involved with the calculations may be determined by layout guidelines, routing rules, and other similar fabrication parameters. For example, a smallest rotation step size may be determined by a rotational accuracy of a die placement machine (not shown) that automatically places the dies 104A–C on the substrate 102. Likewise, a smallest position step size may be determined by a linear accuracy of the die placement machine. Other parameters and considerations may be accounted for to meet the design criteria of a particular process.

Once the die 104 has been rotated and/or moved, a check may be made of all routed nets and the target net for interconnect requirements and rules satisfaction (e.g., decision block 156). If all routed nets and the target net satisfy all requirements and rules (e.g., the YES branch of decision block 156), then processing may continue with the current die positions and die orientations (e.g., block 158). If one or more requirements and/or rules are violated (e.g., the NO branch of decision block 156), then a check may be made to determine if the range of linear positions and/or angles has been exhausted (e.g., decision block 160). If all allowed combinations of positions and angles have been tried without success (e.g., the YES branch of decision block 160), then an error message may be presented and the processing ended (e.g. block 162). If allowable combinations of position and angles remain unchecked (e.g., the NO branch of decision block 160), then the process may iterate with additional angles and positions (e.g., block 154).

Figure 7:
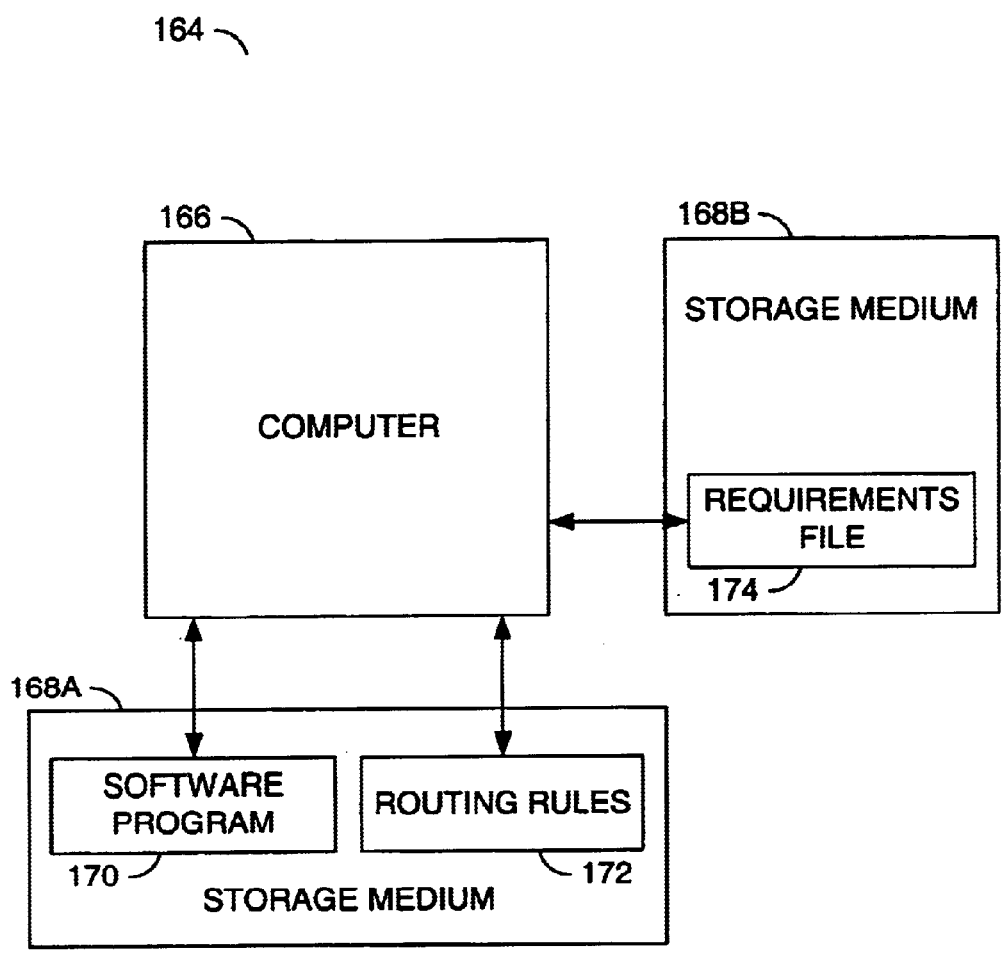
FIG. 7 is a block diagram of an apparatus implementing the die placement process.

Referring to FIG. 7, a block diagram of an example apparatus 164 implementing the die placement process is shown. The apparatus 164 may be implemented as a computer 166 and one or more storage mediums 168A–B. A storage medium 168A may store a software program 170 and a file 172. The software program 170 may define the steps of the die placement process. The file 172 may define the routing rules. The storage medium 168B may hold a file 174 containing the requirements and netlist for the dies 104A–C.

The software program 170 may be read and executed by the computer to implement the process of finding placement angles and positions for each die 104A–C on the substrate 102. The interconnect requirements file 174 and routing rules file 172 may be accessed as necessary during execution. In one embodiment, the software program 170, routing rules file 172 and requirement/netlist file 174 may be stored in the same storage medium 168.

The present invention generally defines a process that is a procedural approach describing the steps involved and the order of the steps to implement the concept of flexibly orienting die placements in a multi-chip package. The process may be automated by someone of ordinary skill in the art so that the implementation may be efficient and the optimal result can be attained.

The function performed by the flow diagrams of FIGS. 2–6 may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, FPGAs, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, and magneto-optical disks, ROMs, RAMs, EPROMs, EEPROMs, Flash memory, magnetic or optical cards, or any type of media suitable for storing electronic instructions.

While the invention has been particularly shown and described with reference to the preferred embodiments thereof, it will be understood by those skilled in the art that various changes in form and details may be made without departing from the spirit and scope of the invention.

What is claimed is:

1. A method for interconnecting a plurality of dies, comprising the steps of:
   (A) receiving a plurality of interconnect requirements for said plurality of dies, said plurality of interconnect requirements comprising (i) a priority order for each of a plurality of nets and (ii) at least one delay from a group of delays consisting of a shortest possible delay, a maximum delay, a range of delays, and a ratsnest delay;
   (B) calculating a position and an angle for one of said plurality of dies relative to a substrate mounting of said plurality of dies in response to said plurality of interconnect requirements; and
   (C) routing said plurality of nets among said plurality of dies and a plurality of substrate pads on said substrate, said plurality of substrate pads defining external connections.

2. The method according to claim 1, wherein step (C) further comprises the sub-step of routing said plurality of nets one at a time in descending order of said priority order.

3. The method according to claim 2, further comprising the step of rotating one of said plurality of dies in response to a target net of said plurality of nets having a shortest possible length requirement of said plurality of interconnect requirements.

4. The method according to claim 2, further comprising the step of moving one of said plurality of dies in response to a target net of said plurality of nets having a shortest possible length requirement of said plurality of interconnect requirements.

5. The method according to claim 1, further comprising the step of rotating one of said plurality of dies in response to a target net of said plurality of nets failing to meet at least one of said plurality of interconnect requirements.

6. The method according to claim 1, further comprising the step of moving one of said plurality of dies in response to said a target net of said plurality of nets failing to meet at least one of said plurality of interconnect requirements.

7. The method according to claim 1, wherein a trace group comprises routing together at least two nets of said plurality of nets.

8. A method for interconnecting a plurality of dies, comprising the steps of:
   (A) receiving a plurality of interconnect requirements for said plurality of dies, said plurality of interconnect requirements comprising a priority order for each of a plurality of nets;
   (B) calculating a position and an angle for one of said plurality of dies relative to a substrate mounting of said plurality of dies in response to said plurality of interconnect requirements; and
   (C) routing said plurality of nets among said plurality of dies and a plurality of substrate pads on said substrate, said plurality of substrate pads defining external connections, wherein (i) a trace group comprises routine together at least two nets of said plurality of nets and (ii) said plurality of interconnect requirements further comprise a maximum delay variation among said at least two nets of said trace group.

9. A storage medium for use in a computer for interconnecting a plurality of dies, the storage medium recording a computer program that is readable and executable by the computer, the computer program comprising the steps of:
   (A) receiving a plurality of interconnect requirements for said plurality of dies;
   (B) calculating a position and an angle for one of said plurality of dies relative to a substrate mounting said plurality of dies in response to said plurality of interconnect requirements; and
   (C) routing a plurality of nets among said plurality of dies and a plurality of substrate pads on said substrate, said plurality of substrate pads defining external connections, wherein i) a trace group comprises routing together at least two nets of said plurality of nets and (ii) said plurality of interconnect requirements comprise a maximum delay variation among said at least two nets of said trace group.

10. The storage medium according to claim 9, wherein said plurality of interconnect requirements further comprise a priority order for each of said plurality of nets.

11. The storage medium according to claim 10, wherein step (C) further comprises the sub-step of routing said plurality of nets one at a time in descending order of said priority order.

12. The storage medium according to claim 11, further comprising the step of rotating one of said plurality of dies in response to a target net of said plurality of nets having a shortest possible length requirement of said plurality of interconnect requirements.

13. The storage medium according to claim 11, further comprising the step of moving one of said plurality of dies in response to a target net of said plurality of nets having a shortest possible length requirement of said plurality of interconnect requirements.

14. The storage medium according to claim 9, further comprising the step of rotating one of said plurality of dies in response to a target net of said plurality of nets failing to meet at least one of said plurality of interconnect requirements.

15. The storage medium according to claim 9, further comprising the step of moving one of said plurality of dies in response to said a target net of said plurality of nets failing to meet at least one of said plurality of interconnect requirements.

16. An apparatus comprising:
   means for receiving a plurality of interconnect requirements for a plurality of dies, said plurality of interconnect requirements comprising (i) a priority order for each of a plurality of nets and (ii) at least one delay from a group of delays consisting of a shortest possible delay, a maximum delay, a range of delays, and a ratsnest delay;
   means for calculating a position and an angle for one of said plurality of dies relative to a substrate mounting of said plurality of dies in response to said plurality of interconnect requirements; and
   means for routing said plurality of nets among said plurality of dies and a plurality of substrate pads on said substrate, said plurality of substrate pads defining external connections.

17. A method for interconnecting a plurality of dies, comprising the steps of:
(A) receiving a plurality of interconnect requirements for said plurality of dies, said Plurality of interconnect requirements comprising at least one delay from a group of delays consisting of a shortest possible delay, a maximum delay, a range of delay, and a ratsnest delay;
(B) calculating a position and an angle for one of said plurality of dies relative to a substrate mounting of said plurality of dies in response to said plurality of interconnect requirements;
(C) routing a plurality of nets among said plurality of dies and a plurality of substrate pads on said substrate, said plurality of substrate pads defining external connections; and
(D) rotating one of said plurality of dies in response to a target net of said plurality of nets failing to meet at least one of said plurality of interconnect requirements.

18. The method according to claim 17, wherein said plurality of interconnect requirements further comprise a priority order for each of said plurality of nets.

* * * * *